United States Patent
Gong et al.

[11] Patent Number: 5,966,608
[45] Date of Patent: Oct. 12, 1999

[54] METHOD OF FORMING HIGH VOLTAGE DEVICE

[75] Inventors: Jeng Gong; Sheng-Hsing Yang, both of Hsinchu, Taiwan

[73] Assignee: United Microelectronics Corp., Taipei, Taiwan

[21] Appl. No.: 09/085,208

[22] Filed: May 27, 1998

[30] Foreign Application Priority Data

Apr. 3, 1998 [TW] Taiwan ................................ 87105065

[51] Int. Cl.⁶ .................................................. H01L 21/265
[52] U.S. Cl. .......................................... 438/307; 438/529
[58] Field of Search ................................... 438/194, 199, 438/306, 227, 228, 307, 268, 273, 529; 257/335, 336, 339, 344, 346

[56] References Cited

U.S. PATENT DOCUMENTS 4,716,126  12/1987  Cogan ...................................... 438/268
4,970,173  11/1990  Robb ....................................... 438/273

*Primary Examiner*—Olik Chaudhuri
*Assistant Examiner*—Anh Duy Mai

*Attorney, Agent, or Firm*—Thomas, Kayden, Horstemeyer & Risley, LLP

[57] ABSTRACT

A method of forming high voltage device. A first type semiconductor having at least a gate formed thereon is provided. A first ion implantation with a second type dopant is performed to form a first diffusion region in the semiconductor substrate. An oxide layer is formed on the semiconductor substrate. A second ion implantation with the second type dopant is performed to form a second diffusion region within the first diffusion region. A silicon nitride layer is formed on the oxide layer, through which an opening penetrates to exposed the oxide layer. A third ion implantation with the second type dopant is performed using the silicon nitride layer as a mask to form a third diffusion region within the second diffusion region. Drive-in is performed to deepen the third diffusion region. The silicon nitride layer is removed. The exposed oxide layer is transformed into a field oxide layer. A fourth ion implantation with a first type dopant is performed to form a fourth diffusion region as a source/drain region within the second diffusion region under a surface between the field oxide layer and the gate.

15 Claims, 3 Drawing Sheets

METHOD OF FORMING HIGH VOLTAGE DEVICE

CROSS-REFERENCE TO RELATED APPLICATION

This application claims the priority benefit of Taiwan application serial no. 87105065, filed Apr. 3, 1998, the full disclosure of which is incorporated herein by reference.

BACKGROUND OF THE INVENTION

1. Field of the Invention

The invention relates to a method of forming a semiconductor device, and more particularly, to a method which employs doping with different kind of dopant of different concentration to change electric field of a semiconductor device.

2. Description of the Related Art

In FIG. 1, a cross sectional view of a complementary metal oxide semiconductor (CMOS) is shown. In an N-type semiconductor substrate 100, using dopant diffusion or ion implantation, a P-type region 102 is formed. A PMOS transistor is formed on the N-type semiconductor substrate 100, and an NMOS transistor is formed on the P-type region. The NMOS transistor comprises a gate 104 and a P-type source/drain region 106, and the PMOS transistor comprises a gate 104 and an N-type source/drain region 108. The NMOS transistor is isolated from the PMOS transistor by a field oxide layer 110.

As the devices are designed and developed towards a smaller and smaller dimension, the channel length becomes shorter and shorter. The reduced channel length causes a faster operation speed of a device and other short channel effects. According to the formula "E=V/D", in which E is the electric field, V is the voltage, and d is the channel length, providing a constant voltage, the electric filed is increased abruptly with reducing the channel length. The abrupt increase of electric field accelerates the electron in the channel. As a consequence, the electric breakdown occurs.

In the application of radio frequency (RF), a high power gain is required to improve the frequency response. A direct method to increase the power gain is to increase the transconductance gm. While the transconductance gm is increased, the electric field across the channel is increase. In Reverse, the transconductance gm Is increased by increasing the electric field across the channel. However, considering the limitation due to short channel effect and electric breakdown, it is difficult to obtain a high transconductance $g_m$.

SUMMARY OF THE INVENTION

It is therefore an object of the invention to provide a method of forming a high voltage device. The carrier transportation along longitudinal direction is avoided. Therefore, the formation of a parasitic bipolar junction transistor is avoided. The effect and performance of the device is thus maintained without being degraded.

To achieve these objects and advantages, and in accordance with the purpose of the invention, as embodied and broadly described herein, the invention is directed towards a method of forming a high voltage device. A first type semiconductor having at least a gate formed thereon is provided. A first ion implantation with a second type dopant is performed to form a first diffusion region in the semiconductor substrate. An oxide layer is formed on the semiconductor substrate. A second ion implantation with the second type dopant is performed to form a second diffusion region within the first diffusion region. A silicon nitride layer is formed on the oxide layer, through which an opening penetrates to exposed the oxide layer. A third ion implantation with the second type dopant is performed using the silicon nitride layer as a mask to form a third diffusion region within the second diffusion region. Drive-in is performed to deepen the third diffusion region. The silicon nitride layer is removed. The exposed oxide layer is transformed into a field oxide layer. A fourth ion implantation with a first type dopant is performed to form a fourth diffusion region as a source/drain region within the second diffusion region under a surface between the field oxide layer and the gate.

It is to be understood that both the foregoing general description and the following detailed description are exemplary and explanatory only and are not restrictive of the invention, as claimed.

DESCRIPTION OF THE PREFERRED EMBODIMENTS

Figure 1:
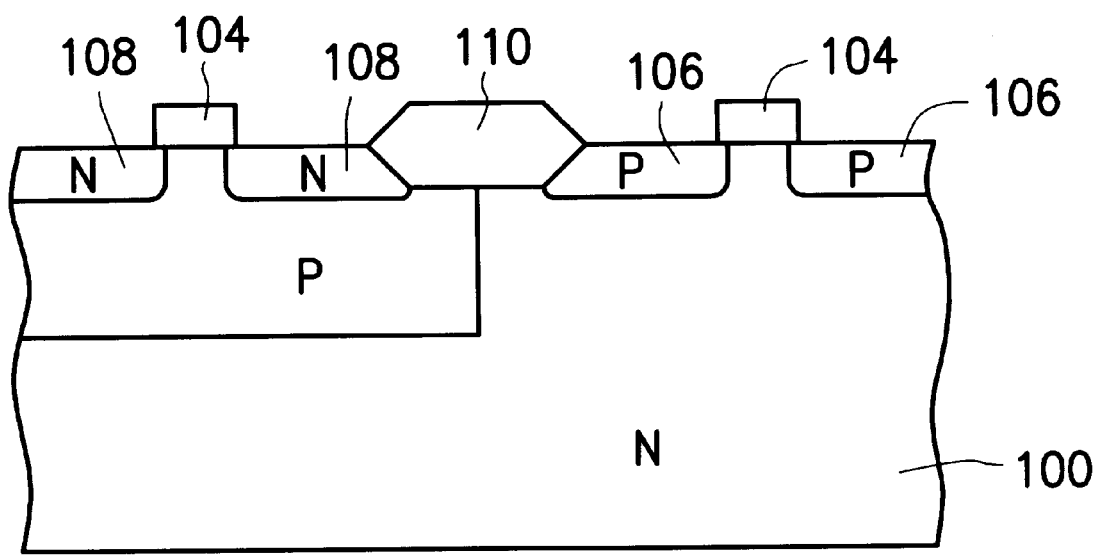
FIG. 1 shows a cross sectional view of a conventional complementary MOS.
Figure 2A:
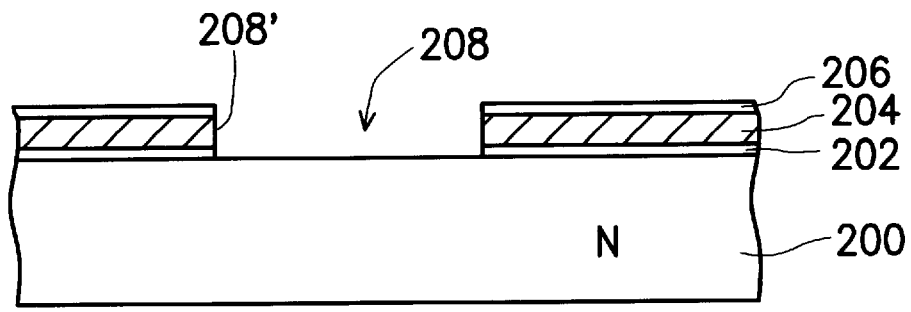
FIG. 2A to FIG. 2F shows a cross sectional view, in which a method of forming a high voltage device in a preferred embodiment according to the invention is shown.

In FIG. 2A, on a semiconductor substrate 200, a gate oxide layer 202, a polysilicon layer 204 and a first oxide layer 206 is formed. In the embodiment, an N-type substrate is adapted. However, it is to be noted that the type of the substrate is not restricted as described in this embodiment. The gate oxide layer 202 is, for example, formed by thermal oxidation with a thickness of about 500 Å to 1500 Å. The poly-silicon layer 204 is, for example, formed by chemical vapor deposition (CVD) with a thickness of about 3000 Å to 7000 Å. The first oxide layer 206 is formed, for example, by thermal oxidation with a thickness of about 300 Å to 700 Å. Using a mask, the first oxide layer 206, poly-silicon layer 204 and gate oxide layer 202, are removed so that an opening 208 is formed to expose the substrate 200 therewithin. The opening 208 has a sidewall denoted as 208'. A gate is formed by stacking the first oxide layer 206, poly-silicon layer 204 and gate oxide layer 202.

Figure 2B:
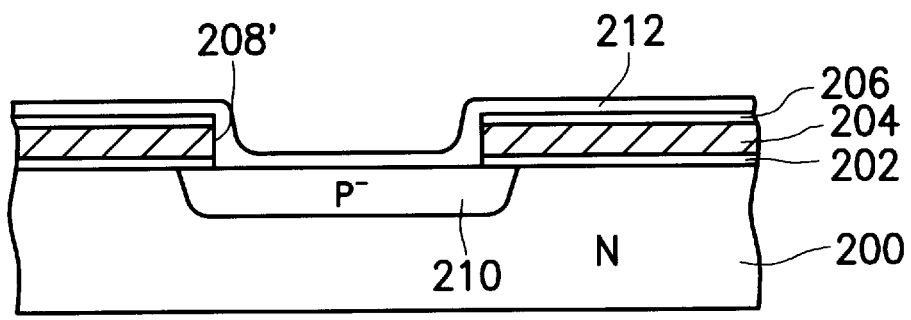

In FIG. 2B, via the opening 208, a first self-aligned ion implantation and drive-in process is performed, so that a first diffusion region is created in the substrate 200. In this embodiment, a $P^-$ diffusion region 210 is formed with a concentration less than or equal to about $10^{17}/cm^3$. Again, it is to be noted that the diffusion region is not restricted as the embodiment. The substrate 200 is implanted with nitrogen. A second oxide layer 212 is formed on the structure shown in FIG. 2B. The second oxide layer 212 is, for example, formed by thermal oxidation. The surface being directly implanted with nitrogen has a slower rate for oxide growth. As a consequence, the second oxide layer 212 on the first oxide layer 206 and the substrate 200 within the opening 208 is thinner than the second oxide layer 212 on the sidewall 208'.

Figure 2C:
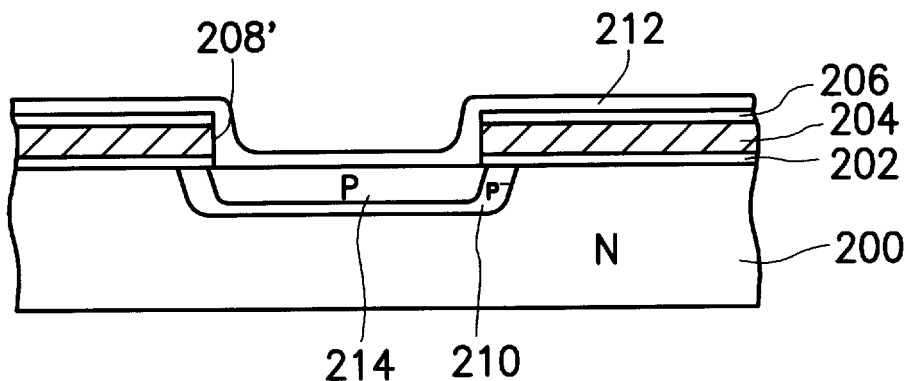

In FIG. 2C, a second ion implantation and drive-in process is performed, so that a second diffusion region is formed with a concentration less than or equal to about $10^{18}/cm^3$. Due to the second oxide layer 212 on the sidewall 208', the second diffusion region is formed within the $P^-$ diffusion region 210. The second diffusion region is, for example, a P diffusion region 214 doped with P-type dopant. Hence, a channel region comprising two different diffusion regions 210 and 214 is formed. In the channel region, a large transconductance $g_m$ is obtained in P diffusion region 214, whereas the P⁻ diffusion region 210 controls the threshold voltage.

Figure 2D:
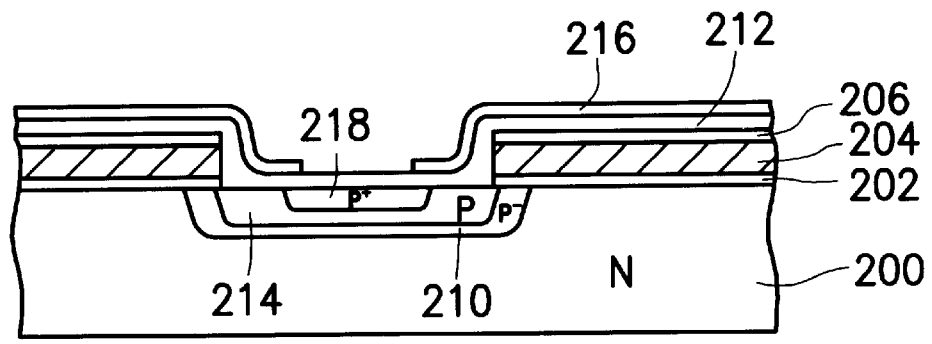

In FIG. 2D, a silicon nitride layer 216 is formed on the structure shown in FIG. 2C. The silicon nitride layer 216 is defined as a mask to expose a part of the silicon oxide layer 212. A third ion implantation is performed to form a third diffusion region within the P diffusion region, for example, a P⁺ diffusion region 218 in this embodiment.

Figure 2E:
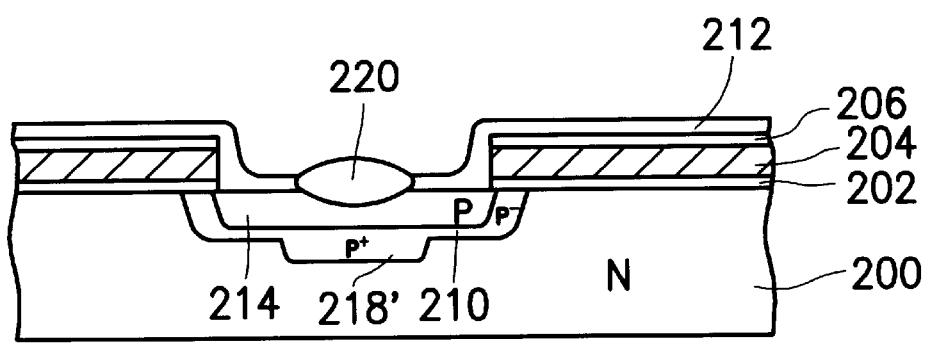

In FIG. 2E, a drive-in process is performed, so that P⁺ ion within the P⁺ diffusion region 218 diffuses down towards the substrate 200. A deeper P⁺ diffusion region 218' is formed under the P⁻ diffusion region 210 within the range under the bottom surface of the opening 208. A field oxide layer 220 is then formed on the exposed silicon oxide layer, for example, by thermal oxidation. After the formation of the field oxide layer 220, the silicon nitride layer 216 is removed.

Figure 2F:
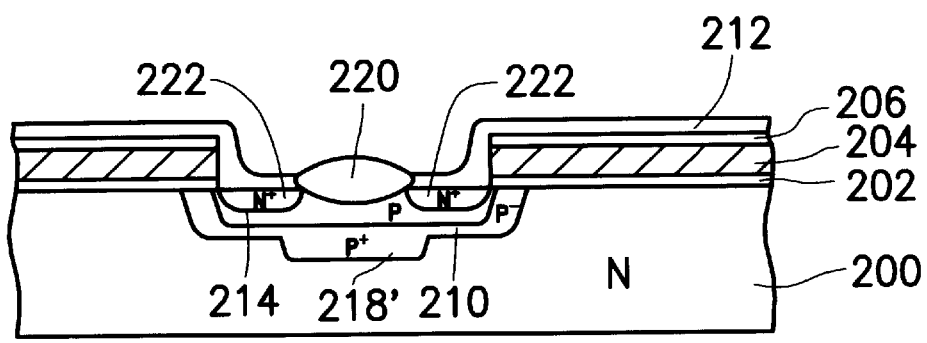

In FIG. 2F, using a mask, a fourth ion implantation, for example, N⁺ ion, is performed. An annealing process is then performed, so that a N⁺ diffusion region is formed as a source/drain region 222 within the P diffusion region 214 under a surface between the field oxide layer 220 and the gate.

In this embodiment, an N-type substrate 200 is used. While carriers transport vertically from the N⁺ source/drain 222 and the P diffusion region to the N type substrate 200 without the formation of the P⁺ diffusion region 218', a parasitic bipolar junction transistor which degrades the quality of the device is formed. In the invention, a deeper P⁺ diffusion region 218' is formed to avoid the vertical transportation of carriers. Therefore, the majority of carriers transports horizontally through the channel regions. The formation of a parasitic bipolar junction transistor is prevented.

In the invention, the diffusion regions are formed using self-aligned ion implantation without additional mask, so that the process is simplified with a lower cost. The misalignment caused during exposure is avoided.

Another feature of the invention is that a higher transconductance $g_m$ is obtained by forming a P⁺ diffusion region. The threshold voltage is controlled by the P⁻ diffusion region.

Yet, another feature of the invention is that a deeper diffusion region is formed. The vertical transportation of carriers towards the substrate is prevented, so that the formation of a parasitic bipolar junction transistor is avoided. Therefore, the majority of carriers transports horizontally through the channel region. The performance of the device is enhanced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a high voltage device, wherein a semiconductor substrate having at least a gate formed thereon is provided, comprising:

forming a first diffusion region in the semiconductor substrate;

forming an oxide layer on the semiconductor substrate;

forming a second diffusion region within the first diffusion region;

forming a third diffusion region within the second diffusion region;

deepening the third diffusion region by drive-in to form a deepened third diffusion region under the first diffusion region without deepening either the first or second diffusion regions;

transforming a part of the oxide layer into a field oxide layer on the second diffusion region; and forming a fourth diffusion region as a source/drain region within the second diffusion region under a surface between the field oxide layer and the gate.

2. The method according to claim 1, wherein the semiconductor substrate includes a first type substrate.

3. The method according to claim 2, wherein the first diffusion region includes a second type diffusion region with a concentration of less than or equal to about $10^{17}$ cm⁻³.

4. The method according to claim 3, wherein the first type includes an N type, and the second type includes a P type.

5. The method according to claim 3, wherein the first type includes a P type, and the second type includes an N type.

6. The method according to claim 2, wherein the second diffusion region includes the second type diffusion region with a concentration less than or equal to about $10^{18}$ cm⁻³.

7. The method according to claim 2, wherein the third diffusion region includes the second type diffusion region with a concentration heavier than the second diffusion region.

8. The method according to claim 2, wherein the source/drain region includes a first type heavily doped region.

9. A method of forming a high voltage device, wherein a first type semiconductor having at least a gate formed thereon is provided, comprising:

performing a first ion implantation with a second type dopant to form a first diffusion region in the semiconductor substrate;

forming an oxide layer on the semiconductor substrate;

performing a second ion implantation with the second type dopant to form a second diffusion region within the first diffusion region;

forming a silicon nitride layer on the oxide layer, through which an opening penetrates to expose the oxide layer;

performing a third ion implantation with the second type dopant, using the silicon nitride layer as a mask to form a third diffusion region within the second diffusion region;

performing drive-in to deepen the third diffusion region, under a portion of the first diffusion region without deepening either the first diffusion region or the second diffusion region;

removing the silicon nitride layer;

transforming the exposed oxide layer into a field oxide layer; and performing a fourth ion implantation with a first type dopant to form a fourth diffusion region as a source/drain region within the second diffusion region under a surface between the field oxide layer and the gate.

10. The method according to claim 9, wherein the first diffusion region has a concentration of less than or equal to about $10^{17}$ cm⁻³.

11. The method according to claim 9, wherein the second diffusion region has a concentration less than or equal to about $10^{18}$ cm⁻³.

12. The method according to claim 9, wherein the third diffusion region has a concentration heavier than the second diffusion region.

13. The method according to claim 9, wherein the source/drain region includes a heavily doped region.

14. The method according to claim 9, wherein the first type includes an N type, and the second type includes a P type.

15. The method according to claim 9, wherein the first type includes a P type, and the second type includes an N type.

* * * * *